(12) United States Patent
Ehm et al.

(10) Patent No.: US 8,279,397 B2
(45) Date of Patent: Oct. 2, 2012

(54) METHOD FOR REMOVING CONTAMINATION ON OPTICAL SURFACES AND OPTICAL ARRANGEMENT

(75) Inventors: Dirk Heinrich Ehm, Lauchheim (DE); Johannes Hubertus Josephina Moors, Helmond (NL); Bastiaan Theodoor Wolschrijn, Abcoude (NL); Vadim Banine, Helmond (NL); Vladimir Vitalevitsch Ivanov, Moscow (RU)

(73) Assignees: Carl Zeiss SMT GmbH, Oberkochen (DE); ASML Netherlands B.V., Veldhoven (NL)

( * ) Notice: Subject to any disclaimer, the term of this patent is extended or adjusted under 35 U.S.C. 154(b) by 531 days.

(21) Appl. No.: 12/469,546

(22) Filed: May 20, 2009

(65) Prior Publication Data
US 2009/0314931 A1 Dec. 24, 2009

Related U.S. Application Data

(63) Continuation of application No. PCT/EP2007/010003, filed on Nov. 20, 2007.

(30) Foreign Application Priority Data

Nov. 21, 2006 (DE) .......................... 10 2006 054 726

(51) Int. Cl.
*G03B 27/52* (2006.01)
(52) U.S. Cl. .......................................... 355/30; 355/77
(58) Field of Classification Search ..................... 355/30, 355/67, 77
See application file for complete search history.

(56) References Cited

U.S. PATENT DOCUMENTS

| 6,252,648 | B1* | 6/2001 | Hase et al. .................. 355/53 |
| 6,770,895 | B2 | 8/2004 | Roux |
| 6,894,293 | B2 | 5/2005 | Roux |
| 7,050,149 | B2* | 5/2006 | Owa et al. ................. 355/30 |
| 7,116,394 | B2* | 10/2006 | Bakker et al. .............. 355/30 |
| 7,355,672 | B2* | 4/2008 | Van Herpen et al. ........... 355/30 |
| 7,868,304 | B2* | 1/2011 | Bakker et al. .............. 250/492.2 |
| 2003/0190012 | A1 | 10/2003 | Ahmad |

(Continued)

FOREIGN PATENT DOCUMENTS

EP 371693 B1 11/1989

(Continued)

OTHER PUBLICATIONS

English translation of the Office action of the Japanese Patent Office dated May 22, 2012 in parallel Japanese patent application 2009-537522.

*Primary Examiner* — Thomas R Artman
(74) *Attorney, Agent, or Firm* — Walter Ottesen

(57) ABSTRACT

A method and an optical arrangement for removing contamination on optical surfaces (26), which are arranged in a vacuum environment in an optical arrangement, preferably in a projection exposure apparatus (1) for EUV lithography. The method includes generating a residual gas atmosphere containing molecular hydrogen (18) and at least one inert gas (17) in the vacuum environment, generating inert gas ions (21) by ionization of the inert gas (17), preferably with EUV radiation (20), and generating atomic hydrogen (27) by acceleration of the inert gas ions (21) in the residual gas atmosphere, to remove the contamination.

22 Claims, 3 Drawing Sheets

U.S. PATENT DOCUMENTS

| | | | |
|---|---|---|---|
| 2004/0032574 A1* | 2/2004 | Koster et al. | 355/30 |
| 2004/0211448 A1* | 10/2004 | Klebanoff et al. | 134/39 |
| 2004/0218157 A1* | 11/2004 | Bakker et al. | 355/30 |
| 2006/0072084 A1* | 4/2006 | Van Herpen et al. | 355/30 |
| 2007/0012889 A1 | 1/2007 | Sogard | |
| 2011/0058147 A1* | 3/2011 | Ehm et al. | 355/30 |

FOREIGN PATENT DOCUMENTS

| | | |
|---|---|---|
| EP | 1643310 A1 | 10/2005 |
| EP | 1764653 A2 | 9/2006 |
| WO | 2004104707 A2 | 12/2004 |
| WO | 2005109971 A2 | 11/2005 |
| WO | 2007064210 A1 | 6/2007 |

* cited by examiner

METHOD FOR REMOVING CONTAMINATION ON OPTICAL SURFACES AND OPTICAL ARRANGEMENT

CROSS-REFERENCE TO RELATED APPLICATIONS

This is a Continuation of International Application PCT/EP2007/010003, with an international filing date of Nov. 20, 2007, which was published under PCT Article 21(2) in German, and the entire disclosure of which, including amendments, is incorporated into this application by reference. The present application also claims priority under 35 U.S.C. §119 (a) of the German patent application DE 10 2006 054 726.8 filed on 21 Nov. 2006, the entire disclosure of which is incorporated into this application by reference.

FIELD OF AND BACKGROUND OF THE INVENTION

The invention relates to a method for removing contamination on optical surfaces, which are arranged in a vacuum environment, preferably in a projection exposure apparatus for EUV (extreme ultraviolet) lithography, and to an optical arrangement.

In operation, contaminating substances gradually accumulate on the surfaces of optical elements, in particular multilayer mirrors that are used in EUV lithography systems. These substances form, for example, through the reaction of residual gases present in the vacuum environment of the optical surfaces with the EUV radiation to form low-volatile solids. Gases that form such a low-volatile oxidic solid with oxidizing radicals such as OH•, O• arising from the EUV radiation, are for example, sulphur, phosphorus, fluorine or silicon compounds, which may outgas from components (resist etc.) present in the apparatus. Furthermore, gaseous hydrocarbons present in the environment of the optical elements may deposit a layer of carbon on the surfaces.

The formation of a low-volatile solid on the surface of optical elements is highly undesirable, since the substance being deposited gives rise to increased light scattering and absorption. As a result, the optical performance of the overall system in which the optical elements are used declines with respect to transmission, uniformity, stray light and image defects. To reduce the contamination, it is known to bring the optical surfaces into contact with activated hydrogen, i.e. hydrogen that exists in the form of H•, H⁺ and/or $H_2^+$. In this way, on the one hand the carbon is converted into readily volatile hydrocarbons such as methane, and, on the other hand, the oxidic solids compounds can be converted by reduction to readily volatile hydrides.

Currently, to clean optical surfaces in EUV lithography apparatuses by means of activated hydrogen, only methods that cannot be carried out during the exposure operation are used. To clean the surfaces, the exposure operation therefore has to be interrupted, which leads to increased off-times of the apparatus and hence to higher costs. Furthermore, providing and arranging the necessary components for the EUV lithography apparatus cleaning method gives rise to high structural engineering costs. In the case of the known methods for producing atomic hydrogen, such as generation by a heating wire or by means of a plasma, further adverse effects occur, such as the heating of the optical surface or metal deposition on the wire.

A method of removing carbon contamination from optical surfaces disposed in a vacuum chamber is known from US 2004/0211448 A1. In this method, the optical surface is brought into contact with activated gases in an excited energy state. The cleaning gases used are preferably oxygen and carbon dioxide, and alternatively hydrogen, which are activated by electron bombardment, the electrons required for this purpose being obtained by thermal emission from a heating wire.

SUMMARY OF THE INVENTION

One object of the invention is to provide a method and an optical arrangement that permit the removal of contamination on optical surfaces in an especially simple and cost-effective manner.

According to one formulation, the invention provides a method of the kind mentioned in the introduction which includes: generating a residual gas atmosphere containing molecular hydrogen and at least one inert gas in the vacuum environment; generating inert gas ions by ionizing the inert gas, preferably using EUV radiation, and generating atomic hydrogen by accelerating the inert gas ions in the residual gas atmosphere.

In contrast to the prior art, the atomic hydrogen needed to clean the surfaces is generated by a collision process, in which the inert gas ions, for example, argon ions, split the molecular hydrogen into atomic hydrogen according to the following formula:

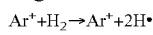

$$Ar^+ + H_2 \rightarrow Ar^+ + 2H\bullet$$

The atomic hydrogen produced in the residual gas atmosphere impinges on the optical surface and is able to remove contamination there in the above-described manner. To achieve an energy transfer that is large enough to split the molecular hydrogen, the inert gas ions are accelerated before the collision process.

The inert gas ions required for this are preferably generated by the EUV radiation that is already present in the optical path during operation of the apparatus, according to the following formula:

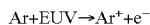

$$Ar + EUV \rightarrow Ar^+ + e^-$$

The invention in this way makes use of the fact that the effective cross-sections for the ionization of certain inert gas ions, such as argon for example, under EUV irradiation are sufficiently large for the present application. On the other hand, the effective cross-sections for a direct conversion (dissociation) of molecular hydrogen into atomic hydrogen by EUV irradiation lie several orders of magnitude below this, so that a direct generation of atomic hydrogen by EUV irradiation of molecular hydrogen in EUV lithography apparatus cannot be achieved to an extent that is sufficient for cleaning the optical surfaces.

In a preferred variant, the inert gas is selected from the group consisting of nitrogen, helium, neon, argon, krypton and xenon. These are typical inert gases that have no influence on the optical surfaces. The larger the (atomic) mass of the gas used, the more unfavorable is the energy transfer to the hydrogen molecules to be split. The inventors have discovered that argon is especially suitable for the present purposes.

In an especially preferred variant, the inert gas ions are segregated from the optical surface. A part of the surface may be abraded by the ion bombardment, which can be exploited in methods such as ion beam figuring (IBF) for shaping the surfaces, but in the present case leads to an undesirable damage of the surface by sputtering. The ions can be segregated from the surface, for example, by using suitable elements of electrically conducting materials, which on contact with positively charged gas ions give off electrons and thus neutralize these ions.

In a preferred variant, the acceleration of the inert gas ions is effected by means of an electromagnetic field, preferably an electrostatic field. The ions can be accelerated in an especially simple manner by electromagnetic forces. In this connection, electrical and/or magnetic fields can be used, which overlap in sections for example and can be time dependent and/or static. A static electrical field is preferred, because this can be generated in an especially simple manner.

In a further advantageous variant, the acceleration can be effected by a homogeneous electrical field, which preferably runs substantially parallel to the optical surface. A homogeneous electrical field distribution accelerates the inert gas ions uniformly. Because the field distribution is parallel to the surface, the ions are accelerated simultaneously in a direction transversely to the surface and are therefore kept away from the optical surface.

In an especially preferred variant, the acceleration of the inert gas ions produces an energy transfer of at least $7.2 \times 10^{-19}$ J per hydrogen molecule. The energy that is required for dissociation of molecular hydrogen is $4.36 \cdot 10^5$ J/mol, i.e., $7.2 \cdot 10^{-19}$ J per hydrogen molecule. In order to achieve measurable cleaning effects using atomic hydrogen, an atomic hydrogen flux typically on the order of magnitude of 1 sccm (standard cubic centimeter per minute) is required. To generate such a flux, approximately 0.3 W is therefore required.

In an advantageous variant, the EUV radiation is generated during the exposure operation by an EUV light source of the projection exposure apparatus. Light sources that come into consideration are in particular plasma-based EUV sources, for example, Xe or Sn plasma discharge sources, and also what are called Hollow Cathode Tube (HCT) or Laser Produced Plasma (LPP) light sources. In this variant of the method, the EUV radiation generated in the apparatus during the exposure operation can be used directly for ionization of the inert gas.

In a further advantageous variant, at least one inert gas flow is generated in the residual gas atmosphere, through which the EUV radiation passes during the exposure operation, the inert gas flow preferably separating a source volume of the EUV light source from the vacuum environment containing the optical surfaces. The inert gas flow may in this case advantageously be generated with a gas outlet, for example, in the form of a nozzle. A collection device for the inert gas, in particular a suction device, which removes the inert gas from the vacuum environment again, is preferably disposed opposite the gas outlet. Part of the inert gas is ionized by the EUV radiation and is removed from the inert gas flow due to the collision process, in particular if in addition an electrical field that is strong enough to counteract the inert gas flow is applied. The inert gas ions formed in the process are subsequently accelerated in order to generate the atomic hydrogen.

The inert gas flow is preferably used to separate a source volume of the EUV light source from the part of the optical arrangement in which the optical surfaces are disposed. The inert gas flow can in this case serve as a gas curtain (dynamic gas lock), which separates a first gas in the source volume of the EUV light source from a second gas, as described in EP 1 422 568, which is incorporated in its entirety into the present application by reference. The inert gas flow prevents both a penetration of contaminating substances from the source volume of the EUV light source into the vacuum environment containing the optical surfaces and also a diffusion of hydrocarbons in the reverse direction. The inert gas flow in this case enters both the source volume and the vacuum environment, in which case the inert gas that has penetrated into the source volume can be separated from the first gas in order to be recycled.

The inert gas flow may alternatively envelop a flow of a gas that serves as a spectral filter (SPF, spectral purity filter), to allow only EUV radiation with a desired spectral characteristic to leave the source volume and enter the vacuum environment containing the optical elements, as is described in detail in US 2007/0012889 A1, which is likewise incorporated in its entirety into the present application by reference. In particular, the inert gas flow can in this case also be in the form of an ultrasonic flow. It is also possible for part of the inert gas flow not to be taken up through the outlet, but to be diverted into the interior of the vacuum environment, in order to ionize the inert gas there by the EUV radiation. Furthermore, the inert gas ions can be accelerated directly out of the inert gas flow by an electrical field oriented, for example, perpendicular or parallel to the inert gas flow.

A further aspect of the invention is embodied in a method for segregating ions, in particular generated by EUV radiation, preferably of an inert gas, from optical surfaces disposed in a vacuum environment, preferably in a projection exposure apparatus for EUV lithography. This method includes: accelerating the ions, preferably with an electromagnetic field, in particular an electrostatic field, and/or neutralizing the ions at at least one electrically conducting body. The acceleration of ions in the optical arrangement can serve not only to produce atomic hydrogen, but may also be used independently thereof to prevent ions generated in the residual gas atmosphere, for example, by EUV irradiation, from impinging upon the optical surfaces and partially abrading them. The ions may also optionally be neutralized at electrically conducting bodies, which are introduced into the optical arrangement for that purpose. Preferably, at least one electrically conducting body serves in this case at the same time to generate an electrical field, which preferably runs substantially parallel to the optical surface. It shall be understood that alternatively the ions can also be accelerated towards an outlet that is connected to a pump, so that the ions can be removed from the vacuum environment.

The invention is also realized in an optical arrangement, in particular a projection exposure apparatus for EUV lithography, having a vacuum housing containing a residual gas atmosphere with molecular hydrogen and at least one inert gas, at least one optical element having an optical surface disposed inside the vacuum housing, a unit generating inert gas ions, preferably an EUV light source, and an acceleration device, which is configured to accelerate the inert gas ions in the residual gas atmosphere to generate atomic hydrogen, in order to remove contamination from the optical surface.

In this connection, the housing of the projection exposure apparatus as a whole may serve as the vacuum housing, or alternatively the vacuum housing may be arranged in the interior of the housing or may be a suitably separated housing part containing the residual gas atmosphere. It is understood that it is sufficient for the residual gas atmosphere to extend only over the environment of the optical surface and not over the entire vacuum housing.

In a preferred embodiment, the inert gas is selected from the group consisting of: nitrogen, helium, neon, argon, krypton and xenon. These inert gases can be introduced into and discharged from the vacuum housing at suitable locations.

In a further advantageous embodiment, the acceleration device is designed to keep the inert gas ions away from the optical surface. It shall be understood that in addition to the acceleration device, also further devices, for example, aperture stops, may be provided, which are able to hold the inert gas ions back from the surfaces.

In an especially preferred embodiment, the acceleration device includes a device for generating an electromagnetic field, preferably an electrostatic field. An electrostatic field can be generated, for example, between two electrically conducting plates, which are at different electrostatic potential, so that a voltage difference develops between the conducting plates. The generally positively charged ions are accelerated in the field towards the negatively charged plate. When the ions strike the plate, they are converted by electron absorption into an electrically neutral state. If the field strength or the voltage difference between the plates is selected to be sufficiently large, a considerable proportion of the ions strikes the plate and thus protects the optical surface against the inert gas ions.

The acceleration device preferably includes a voltage source, which can serve, for example, to generate a voltage difference between two conducting plates.

In a preferred construction of the acceleration device, this includes at least two conducting plates arranged substantially perpendicular to the optical surface. The conducting plates, which are at different potentials, generate a homogeneous electrical field parallel to the optical surface. This field is substantially limited to the region between the plates, and does not extend as far as the optical surface, so that electrostatic charging of the optical surface can be prevented.

In an especially preferred embodiment, the acceleration device is designed to generate an energy transfer of the inert gas ions of $7.2 \times 10^{-19}$ J per hydrogen molecule or more. This amount of energy is sufficient to split the molecular hydrogen. It is understood that such a high energy transfer cannot be achieved for all collisions of the inert gas ions, but the number of hydrogen atoms produced can be increased by a sufficiently strong electrical field and by providing a maximum interaction length of the accelerated ions with the molecular hydrogen.

In a further advantageous embodiment, the partial pressure of the molecular hydrogen lies between $10^{-3}$ mbar and 1 mbar and/or the partial pressure of the inert gas is less than 1 mbar, preferably less than $10^{-2}$ mbar, especially preferably less than $10^{-3}$ mbar. At these partial pressures, the projection exposure apparatus can be set in exposure operation and at the same time these pressures are suitable preferably for the production of atomic hydrogen by the above-described method. In particular the upper limit of the partial pressures may optionally be selected to be higher, provided that a satisfactory transmission of the EUV radiation through the gases in the residual gas atmosphere remains assured.

In a further preferred embodiment, a supply device is present for feeding the inert gas and/or the molecular hydrogen into the vacuum housing. In addition to the customary inlet pipes for molecular hydrogen, a "lock" (or general opening) can be used as the supply device, essentially including a lock with which a subregion of the apparatus can first of all be separated and then exposed to atmospheric pressure in order to exchange individual components, for example, reticles or wafers, as required during operation. Sufficient molecular hydrogen enters the apparatus through the DGL (dynamic gas lock) in order to carry out the above-described method.

In a preferred embodiment, the supply device includes a gas outlet for generating an inert gas flow and preferably a gas inlet for collecting the inert gas flow. The gas outlet may be formed by a nozzle, through which the inert gas emerges under high pressure. The inert gas can be collected again through the gas inlet, whereby a gas curtain, through which the EUV radiation penetrates, is formed between the gas outlet and the gas inlet, so that inert gas ions are able to form there. Alternatively, the inert gas flow, as described in EP 1 422 568, need not be extracted by suction, and can enter the vacuum environment, so that the inert gas ions are directly generated in the residual gas atmosphere existing therein and move away from the EUV light source without further measures being required for that purpose.

In the case of a further advantageous embodiment, the supply device is designed to generate an inert gas flow, which separates a source volume of the EUV light source from the vacuum environment containing the optical surfaces. The inert gas flow may in this case serve to keep any contaminating substances present in the source volume away from the optical surfaces and to prevent penetration of hydrocarbons into the source volume.

Another aspect of the invention is embodied in an optical arrangement, in particular a projection exposure apparatus for EUV lithography, having a vacuum housing containing a residual gas atmosphere, which includes at least one gas, preferably an inert gas, at least one optical element having an optical surface arranged in the vacuum housing, an ion generating unit, preferably an EUV light source. The arrangement also includes an acceleration device which accelerates the ions in the residual gas atmosphere and which is designed to keep the ions away from the optical surface, and/or an electrically conducting body for neutralizing the ions. As already stated above, keeping the ions away from the optical surfaces even without the generation of atomic hydrogen can be advantageous. In particular, the electrically conducting body, which neutralizes the ions, may be part of the acceleration device. For advantageous embodiments of the acceleration device, reference is made to the above description.

Further features and advantages of the invention are apparent from the following description of exemplary embodiments of the invention, based on the Figures of the drawing, which show details associated with the invention, and from the claims. The individual features can be achieved alone or severally in various combinations all within the scope of the invention.

BRIEF DESCRIPTION OF THE DRAWINGS

Exemplary embodiments are illustrated in the schematic drawings and are explained in the following description. In the drawings.

DETAILED DESCRIPTION OF EXEMPLARY EMBODIMENTS

Figure 1A:
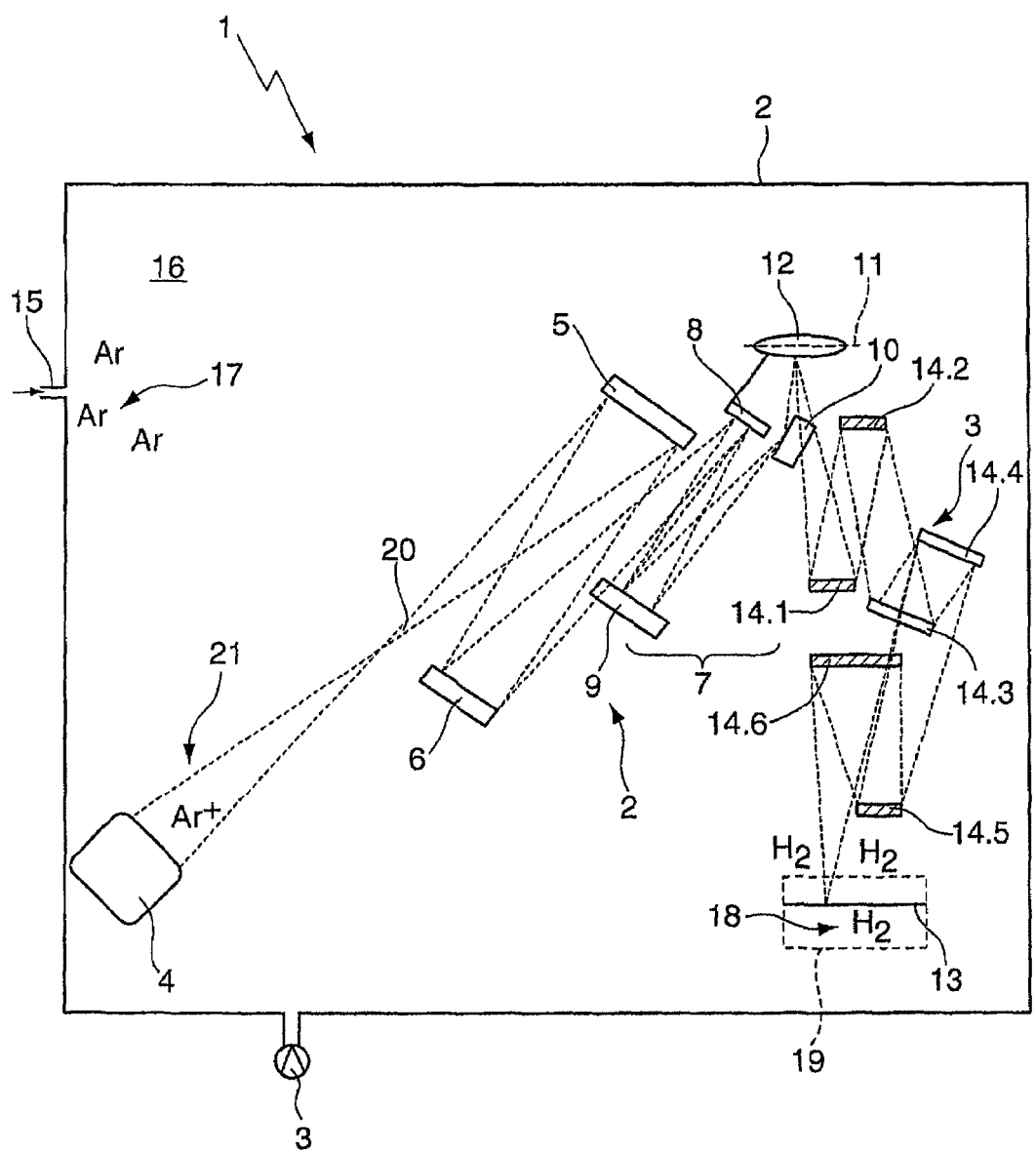
FIGS. 1a, 1b are schematic representations of a projection exposure apparatus for EUV lithography.

A method for removing contamination from optical surfaces using a projection exposure apparatus 1 for EUV lithography, as shown in FIG. 1a, is described below. The projection exposure apparatus 1 includes a housing 2, associated with which is a vacuum unit 3 for generating a vacuum environment, which creates a residual gas atmosphere with an overall pressure in a range between about $10^{-3}$ mbar and 1 mbar in the housing 2.

The housing 2 is divided in accordance with the optical function of the optical elements disposed therein into three housing parts (not illustrated as such in FIG. 1) namely, a first housing part with a light-producing unit 4, which includes a plasma light source and an EUV collector mirror for focusing the illumination beam. The illumination system, which comprises, following the beam path, a mirror 5 with field raster elements and a mirror with pupil raster elements 6, is arranged in a second housing part adjoining the first housing part. A subsequent group of three mirrors acting as telescopic lens 7 includes a first and second mirror 8 and 9 respectively, which are operated under normal incidence, and a third mirror 10 having a negative refractive power, on which the light impinges with grazing incidence. The illuminating system produces an image field that is as homogeneous as possible in an object plane 11, in which a reticle 12 having a structure (not shown) to be reproduced on a smaller scale is arranged.

The structure arranged on the reticle 12 in the object plane 11 is mapped by a subsequent projection apparatus, which is arranged in a third housing part, onto an image plane, in which a wafer 13 having a photosensitive layer (resist) is arranged. For the scaled down imaging, the projection apparatus has six further mirrors 14.1 to 14.6 as reflective optical elements.

Figure 3:
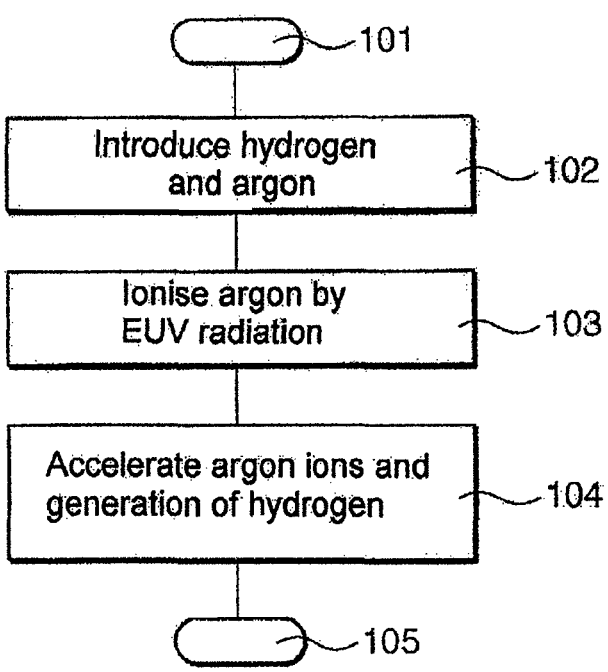
FIG. 3 is a flow chart of one variant of a method for removing contamination from optical surfaces.

In the method illustrated in FIG. 3 for the removal of contamination from optical surfaces, following the start 101, i.e. initiation of the exposure operation in the projection exposure apparatus 1, in a first step 102 an inert gas 17, in the present case argon, is introduced via an inlet 15 into an internal space 16 of the housing 2. Alternatively, or in addition thereto, besides argon also other noble gases or nitrogen can be admitted via the inlet 15 or another inlet. The partial pressure of argon in the residual gas atmosphere of the housing 2 should not be more than 1 mbar, preferably not more than $10^{-2}$ mbar, especially preferably not more than $10^{-3}$ mbar.

In addition to argon as the inert gas 17, molecular hydrogen 18 is also admitted into the residual gas atmosphere in the first step 102, for example, via a lock 19, which surrounds the wafer 13. The lock 19 prevents gases emerging from the resist from being able to get into the projection apparatus. When using a lock 19, molecular hydrogen enters the internal space 16 and generates a partial pressure there in a range between about $10^{-3}$ mbar and 1 mbar, preferably between 0.01 mbar and 1 mbar.

Alternatively, to improve the local molecular hydrogen atmosphere, in particular in the immediate environment of the optical mirror surface, molecular hydrogen can also be fed in at strategically favorable, i.e. at several different positions of the vacuum housing 2.

Once a residual gas atmosphere with molecular hydrogen 18 and argon as the inert gas 17 has been created in the first step 102, in a subsequent second step 103 of the method, the argon enters the EUV radiation 20 generated by the light generating unit 4 and forming a beam path and is ionized thereby. It shall be understood that the argon ions 21 produced by the EUV radiation may also leave the beam path, without recombining and thus their spread is not restricted to the region of the beam path 20.

Figure 1B:
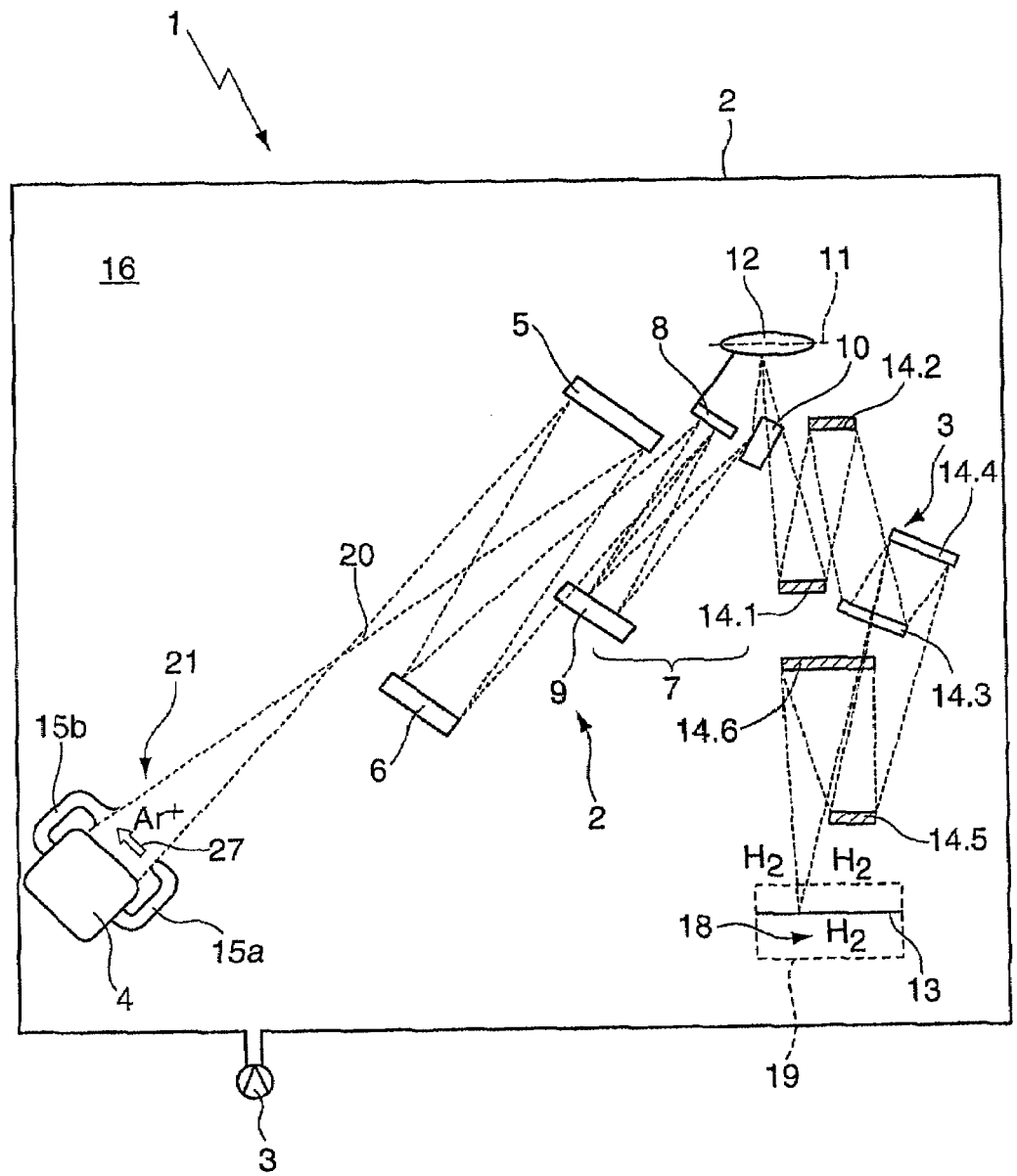
Figure 2:
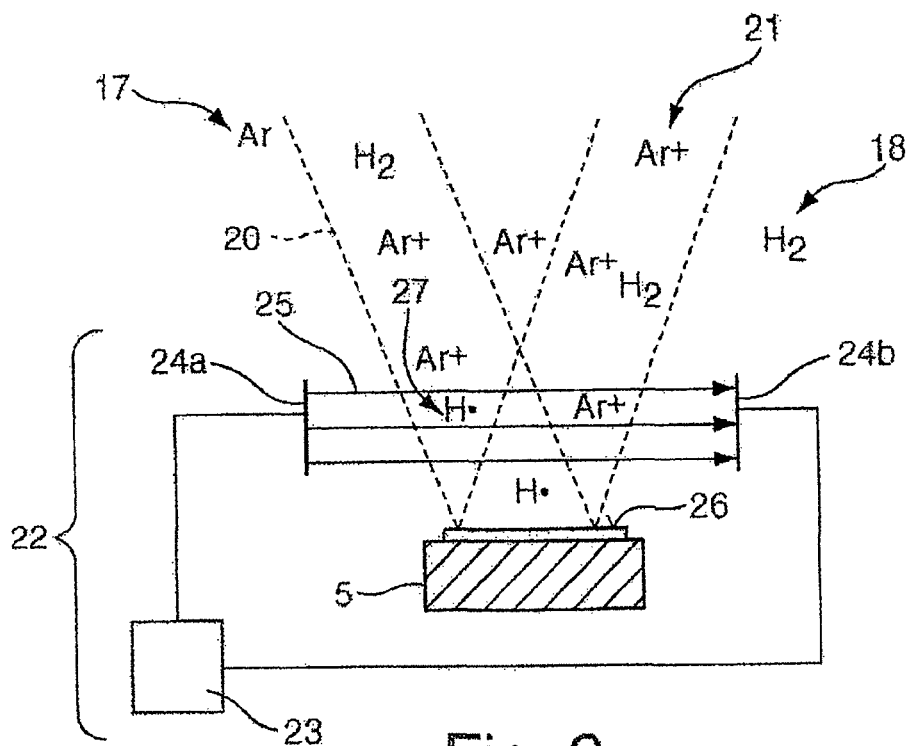
FIG. 2 is a schematic representation of a detail from the apparatus of FIG. 1 with an optical surface and an electrical field running parallel thereto.

In a subsequent third method step 104, the argon ions 21 are accelerated, namely, with an acceleration device 22, as shown by way of example in FIG. 2 in front of the mirror 5 with the field raster elements of FIG. 1. The acceleration device 22 includes a voltage source 23, which sets a first and second electrically conducting plate 24a, 24b at a different electrostatic potential, so that a homogeneous electrostatic field 25 develops between them. In this field the argon ions 21 are accelerated parallel to an optical surface 26 to be cleaned of the mirror 5. The accelerated argon ions 21 undergo collision processes with the molecular hydrogen 18, during which an energy transfer to the molecular hydrogen 18 takes place, which is large enough to split the hydrogen molecules into atomic hydrogen 27. The energy transfer required for that purpose is at least $7.2\times10^{-19}$ J per hydrogen molecule. It shall be understood that not all argon ions 21 in the electrical field 25 are able to generate such an energy transfer; on the contrary, they must first have covered a sufficiently long acceleration path in the electrical field 25 to have a sufficiently large speed or energy. The acceleration device 22 is designed, however, so that the energies required for this purpose can be achieved at short lengths of less than about 50%, related to the overall length of the field, preferably less than about 20%, especially preferably less than about 10%. For that purpose, the voltage source generates between the two plates 24a, 24b a sufficiently large potential difference of typically 10-100 V, optionally up to a few kV, in order to achieve multiple ionizations. The field 25 oriented parallel to the optical surface 26 simultaneously keeps the argon ions 21 away from the optical surface, since they are deflected laterally towards the negatively charged plate 24b and do not strike the optical surface 26. Additionally, argon ions 21 that strike the negatively charged plate 24b absorb electrons from this and are converted thereby into a non-ionized, electrically neutral state. It shall be understood that, if need be, the ions can be kept away from the optical surface also in a different manner, for example, by guiding them into an opening in the negatively charged plate, behind which there is a suction device.

In a last step 105, the atomic hydrogen 27 generated by the acceleration device 22 strikes the optical surface 26, and is able to remove contamination from the surface by reducing oxidic deposits into readily volatile substances. Furthermore, a carbon layer present on the surface 26 can be abraded, through conversion of the carbon to readily volatile hydrocarbons, such as methane. It should be understood that the method steps 101 to 105 carried out in succession here in practice normally proceed simultaneously.

In addition to the creation of atomic hydrogen in the residual gas atmosphere, it is also possible to use the acceleration device 22 of FIG. 2 merely to keep ions, especially of an inert gas, away from the optical surface 26, i.e. to accelerate the inert gas ions without molecular hydrogen being present in the residual gas atmosphere in the housing 2. In this way, damage to the optical surface 26 caused by ion bombardment can be avoided. This is advantageous since gas ions, especially of an inert gas, often form in the residual gas atmosphere in an undesirable manner owing to the EUV radiation.

Finally, FIG. 1b shows an application that differs from FIG. 1a. In FIG. 1b, the inert gas ions are already generated in or at the light generation unit 4. Typically in this case, argon is used as buffer gas to hold back contamination in the plasma light source-collector module. At the light outlet of the light generating unit 4, a gas outlet 15a and a gas inlet 15b are formed, between which an inert gas flow 27 develops in the exposure operation. The inert gas flow 27 in this case forms a gas curtain, which separates the source volume of the light generation unit 4 from the remainder of the internal space 16 of the housing 2. The inert gas flow 27 can be at least partially ionized by the EUV radiation that passes through it and/or by the plasma conditions of the source volume.

Since an EUV projection exposure apparatus is an arrangement of open vacuum vessels, these inert gas ions are able to pass virtually unobstructed into the illumination system and/or the projection apparatus, where they are accelerated in the above-described manner and generate atomic hydrogen.

Alternatively, the inert gas flow can also be introduced into a connector (not shown) between the source volume of the light generation unit 4 and the internal space of the housing 2, and from there is able to enter both the source volume of the light generation unit 4 and the internal space of the housing 2, as described for example, in EP 1 442 568 A2. In this case, it is especially favorable for an already partially ionized gas flow to enter the internal space of the housing 2, so that its inert gas ions 27 merely need to be accelerated in order to generate the atomic hydrogen.

The methods described in conjunction with the projection exposure apparatus 1 may, of course, be used also in other optical arrangements. It is also possible to generate a residual gas atmosphere comprising molecular hydrogen and an inert gas merely in the immediate vicinity of the optical surface, or in confined housing parts or vacuum vessels in such an optical apparatus.

Furthermore, an ionization of the inert gas can also be effected in a manner other than that described here, for example, by local generation of ions through hot glow wires, voltage-induced ("cold") discharges, electron bombardment etc. Optionally, for ionization of the inert gas, for example, a further light source that does not participate in the exposure process may also be used, The above description of the preferred embodiments has been given by way of example. From the disclosure given, those skilled in the art will not only understand the present invention and its attendant advantages, but will also find apparent various changes and modifications to the structures and methods disclosed. The applicant seeks, therefore, to cover all such changes and modifications as fall within the spirit and scope of the invention, as defined by the appended claims, and equivalents thereof.

What is claimed is:

1. A method for removing contamination on an optical surface arranged in a vacuum environment, comprising:
    generating a residual gas atmosphere containing molecular hydrogen and at least one inert gas in the vacuum environment;
    generating inert gas ions by ionizing the inert gas, and generating atomic hydrogen by accelerating the inert gas ions in the residual gas atmosphere; and,
    wherein the inert gas ions are segregated from the optical surface.

2. The method according to claim 1, wherein the vacuum environment comprises a projection exposure apparatus for extreme ultraviolet lithography and the inert gas ions are generated with extreme ultraviolet radiation.

3. The method according to claim 1, wherein the inert gas is selected from the group consisting of nitrogen, helium, neon, argon, krypton and xenon.

4. The method according to claim 1, wherein the inert gas ions are accelerated by an electromagnetic field.

5. The method according to claim 1, wherein the inert gas ions are accelerated by a homogeneous electrical field.

6. The method according to claim 1, wherein the acceleration of the inert gas ions produces an energy transfer of at least $7.2 \times 10^{-19}$ J per hydrogen molecule.

7. The method according to claim 1, wherein the optical surface is arranged in a projection exposure apparatus for extreme ultraviolet radiation lithography, and further comprising generating the extreme ultraviolet radiation during an exposure operation with a source of the extreme ultraviolet light in the projection exposure apparatus.

8. The method according to claim 7, wherein at least one inert gas flow is generated, through which the extreme ultraviolet radiation passes during the exposure operation.

9. The method according to claim 8, wherein the inert gas flow separates a source volume of the light source from the vacuum environment in which the optical surface is arranged.

10. An optical arrangement comprising:
    a vacuum housing containing a residual gas atmosphere, which comprises molecular hydrogen and at least one inert gas,
    at least one optical element having an optical surface disposed in the vacuum housing,
    a unit generating inert gas ions, and
    an acceleration device accelerating the inert gas ions in the residual gas atmosphere to generate sufficient atomic hydrogen to remove contamination from the optical surface; and,
    wherein said acceleration device segregates the inert gas ions from the optical surface.

11. The optical arrangement according to claim 10, wherein the unit comprises a source of extreme ultraviolet light.

12. The optical arrangement according to claim 10, wherein the inert gas is selected from the group consisting of nitrogen, helium, neon, argon, krypton and xenon.

13. The optical arrangement according to claim 10, wherein the acceleration device comprises a device generating an electromagnetic field.

14. The optical arrangement according to claim 13, wherein the acceleration device comprises a device generating an electrostatic field.

15. The optical arrangement according to claim 10, wherein the acceleration device comprises a voltage source.

16. The optical arrangement according to claim 10, wherein the acceleration device generates an energy transfer of the inert gas ions of at least $7.2 \times 10^{-19}$ J per hydrogen molecule.

17. The optical arrangement according to claim 10, wherein at least one of: (a) the partial pressure of the molecular hydrogen lies between $10^{-3}$ mbar and 1 mbar and (b) the partial pressure of the inert gas is less than 1 mbar.

18. The optical arrangement according to claim 10, further comprising a supply device feeding at least one of the inert gas and the molecular hydrogen into the vacuum housing.

19. The optical arrangement according to claim 18, wherein the supply device comprises a gas outlet generating an inert gas flow.

20. The optical arrangement according to claim 18, wherein the supply device further comprises a gas inlet collecting the inert gas flow.

21. The optical arrangement according to, claim 18, wherein the generating unit comprises a source of extreme ultraviolet light, and the supply device generates an inert gas flow separating a source volume of the light source from the vacuum environment containing the optical surface.

22. An optical arrangement comprising:
    a vacuum housing containing a residual gas atmosphere, which comprises molecular hydrogen and at least one inert gas,
    at least one optical element having an optical surface disposed in the vacuum housing,
    a unit generating inert gas ions, and
    an acceleration device accelerating the inert gas ions in the residual gas atmosphere to generate sufficient atomic hydrogen to remove contamination from the optical surface; and,
    said acceleration device including at least two conducting plates arranged at least substantially perpendicular to the optical surface.

* * * * *

UNITED STATES PATENT AND TRADEMARK OFFICE
CERTIFICATE OF CORRECTION

| | | |
|---|---|---|
| PATENT NO. | : 8,279,397 B2 | Page 1 of 1 |
| APPLICATION NO. | : 12/469546 | |
| DATED | : October 2, 2012 | |
| INVENTOR(S) | : Dirk Heinrich Ehm et al. | |

It is certified that error appears in the above-identified patent and that said Letters Patent is hereby corrected as shown below:

In Column 3:
Lines 18 and 19: delete "7.2X10⁻" and "₁₉ J" and substitute -- $7.2 \times^{-19}$ J -- therefor.
Line 57: insert -- which is found in the residual gas atmosphere, -- after "gas,".

In Column 9:
Line 18: delete "used," and substitute -- used. -- therefor.

In Column 10:
Line 45: delete "to," and substitute -- to -- therefor.

Signed and Sealed this
Twentieth Day of November, 2012

David J. Kappos
*Director of the United States Patent and Trademark Office*